United States Patent
Kang (10) Patent No.: US 7,054,181 B2
(45) Date of Patent: May 30, 2006

(54) NON-VOLATILE FERROELECTRIC CELL ARRAY BLOCK HAVING HIERARCHY TRANSFER SENSING ARCHITECTURE

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 22 days.

(21) Appl. No.: 10/878,319

(22) Filed: Jun. 29, 2004

(65) Prior Publication Data

US 2005/0248974 A1    Nov. 10, 2005

(30) Foreign Application Priority Data

May 4, 2004   (KR) ............... 10-2004-0031389

(51) Int. Cl.
*G11C 11/22* (2006.01)
(52) U.S. Cl. ...................... 365/145; 365/196
(58) Field of Classification Search ........... 365/145
See application file for complete search history.

(56) References Cited

U.S. PATENT DOCUMENTS 6,125,076 A * 9/2000 Ishikawa ............... 365/230.06

* cited by examiner

*Primary Examiner*—Thong Q. Le
(74) *Attorney, Agent, or Firm*—Heller Ehrman LLP (57) ABSTRACT

The present invention discloses a non-volatile ferroelectric cell array block having a hierarchy transfer sensing architecture. The cell array block of the invention includes a plurality of sub cell arrays, each with a hierarchy bit line architecture; a plurality of sub bit line sense amplifiers for amplifying a voltage of a sub bit line; main bit line sense amplifier for amplifying a voltage of a main bit line; and a word/plate driver for selectively activating the word line and the plate line in the sub cell array. The cell array block of the invention can be advantageously used for performing more stable read and write operations on a data even with a small sized cell, by having a sub bit line capacitance independent of the main bit line.

7 Claims, 12 Drawing Sheets

NON-VOLATILE FERROELECTRIC CELL ARRAY BLOCK HAVING HIERARCHY TRANSFER SENSING ARCHITECTURE

BACKGROUND OF THE INVENTION

1. Field of the Invention

The present invention relates to a non-volatile ferroelectric cell array block having a hierarchy bit-line architecture, and more particularly, to non-volatile ferroelectric cell array block having a hierarchy transfer sensing architecture, in which during a cell data sensing operation, the capacitance of a respective sub bit-line is independent of the capacitance of a main bit-line so that cell sensing capacitance is limited to the capacitance of the sub bit-line.

2. Description of the Background Art

The ferroelectric memory, i.e., a FeRAM (Ferroelectric Random Access Memory), is paid a lot of attention as a next generation memory because it has a data processing speed similar to that of a DRAM (Dynamic Random Access Memory) and also is capable of preserving stored data even when the power is off.

FeRAM is a memory device having a structure very similar to DRAM, and uses capacitors made of a ferroelectric material to benefit a high remanent polarization characteristic of the ferroelectric material. Due to the remanent polarization of the ferroelectric capacitor, data stored in an FRAM memory cell is not erased even if the electric field applied to the memory cell is removed.

Recently, capacity of the nonvolatile ferroelectric memory has increased up to mega-bytes(Mb) or giga-bytes (Gb). However, as a cell size becomes smaller with the increase of capacity, cell capacitance is also reduced.

Although the bit line capacitance should be reduced for a memory with a small cell capacitance to operate more stably, it is not easy to realize this especially in the case of a high integration memory.

SUMMARY OF THE INVENTION

It is, therefore, an object of the present invention to provide a non-volatile ferroelectric cell array block with an improved circuit structure, whereby a cell data can be read and written more stably even with a small cell capacitance and a layout area can be reduced.

To achieve the above object, there is provided a non-volatile ferroelectric cell array block having a hierarchy sensing architecture, the cell array block including a plurality of sub cell arrays, a plurality of sub bit line sense amplifiers, a main bit line sense amplifier, and a word line/plate line driver. In an exemplary embodiment of the invention, the plurality of sub cell arrays has a hierarchy bit line architecture, in which a plurality of cells for data storage is connected to sub bit lines, and a plurality of the sub bit lines adjacent to both sides of one main bit line are selectively connected to the one main bit line and transfers a cell data. The plurality of sub bit line sense amplifiers corresponding one by one to the sub cell arrays sense, in response to a sensing control signal, a cell data transferred to a sub bit line of a corresponding sub cell array, thereby amplifying a voltage of the corresponding sub bit line. The main bit line sense amp senses the cell data transferred to the one main bit line from the sub bit line amplified by the sub bit line sense amp, thereby amplifying a voltage of the main bit line. The word line/plate driver selectively activates word lines and plate lines of the sub cell array for a read and write operation of the cell data.

Another aspect of the present invention provides a non-volatile cell array block having a hierarchy ferroelectric transfer sensing architecture, the cell array block including a plurality of upper sub cell arrays, a plurality of lower sub cell arrays, a main bit line sense amp, and a word line/plate line driver. In an exemplary embodiment of the invention, the plurality of upper sub cell arrays and the plurality of lower sub cell arrays have a hierarchy bit line architecture, respectively, wherein a plurality of cells for data storage is connected to sub bit lines, and according to a sensing voltage of the sub bit line to which a cell data is applied, the amount of current to be transferred from a power voltage to a main bit line is adjusted to induce a sensing voltage of the main bit line. The main bit line sense amp located between the plurality of upper sub cell arrays and the plurality of lower sub cell arrays, senses, in response to a sensing signal, a sensing voltage of an upper main bit line shared by the plurality of upper sub cell arrays and a sensing voltage of a lower main bit line shared by the plurality of lower sub cell arrays, and amplifies the sensing voltages. The word line/plate line driver selectively activates word lines and plate lines of the sub cell array for a read and write operation of the cell data.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will be described herein below with reference to the accompanying drawings.

Figure 1:
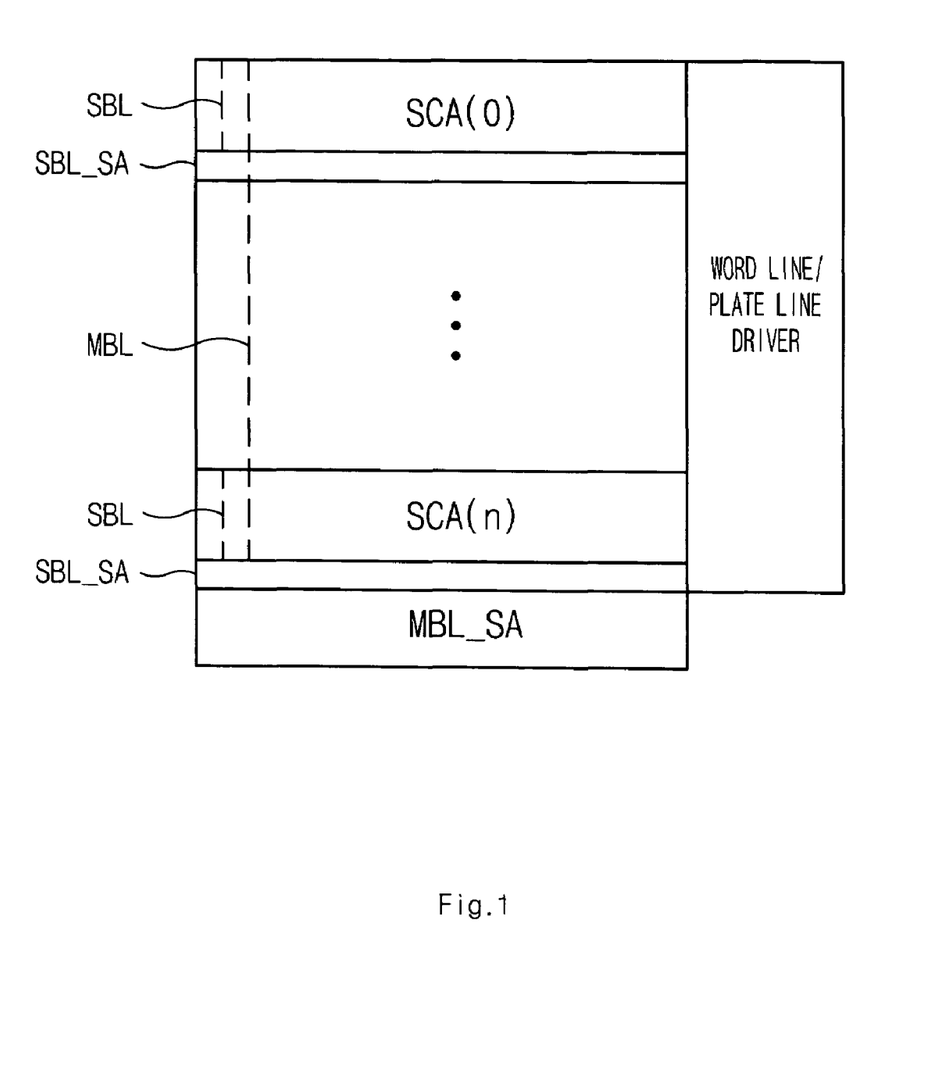
FIG. 1 is a schematic diagram of a non-volatile ferroelectric cell array block in accordance with a first embodiment of the present invention.

FIG. 1 is a schematic diagram of a non-volatile ferroelectric cell array block according to a first embodiment of the present invention.

As shown in FIG. 1, the cell array block includes a plurality of sub cell arrays SCA(0)–SCA(n), each bit line having a hierarchy bit line architecture composed of a main bit line MBL and sub bit lines SBL. The sub bit line SBL is provided to each sub cell array SCA(0)–SCA(n), while the main bit line MBL is shared by the sub cell array SCA(0)–SCA(n), being selectively connected with the sub bit lines SBL. Since the sub bit line SBL are separated from the main bit line MBL, the capacitance of each sub bit line SBL is independent of the capacitance of the main bit line MBL. Thus, it is possible to reduce the capacitance of a bit line where cell sensing charge is transferred. A sensing voltage of a sub bit line SBL in a respective sub cell array SCA(0)–SCA(n) is amplified while the main bit line MBL is disconnected from the sub bit line and the amplified voltage is transferred selectively to the main bit line MBL.

The cell array block illustrated in FIG. 1 includes sub cell arrays SCA(0)–SCA(n), sub bit line sense ampes SBL_SA, a main bit line sense amp MBL_SA, and a word line/plate line driver.

In the sub cell array SCA(0)–SCA(n), ferroelectric memory cells for data storage, each with a ferroelectric capacitor and a transistor, are connected to the sub bit lines SBL. Also, in each sub cell array SCA(0)–SCA(n), the main bit line MBL is shared by a plurality of sub bit lines SBL that are located adjacent to both sides of the main bit line MBL. The cells connected to a plurality of sub bit lines, each in correspondence to a same main bit line MBL, have a folded bit line architecture and thus, they do not share a word line.

The sub bit line sense amp SBL_SA corresponds one by one to each sub cell array SCA(0)–SCA(n), and senses a cell data transferred to the sub bit line SBL and then amplifies the cell data.

The main bit line sense amp MBL_SA, which is activated by a main bit line sense amp enable signal MBL_SA_EN (not shown), senses the cell data transferred from the sub bit line to the main bit line MBL and amplifies the sensed cell data.

The word line/plate line driver selectively activates a word line and a plate line in the sub cell array SCA(0)–SCA(n) to control the read/write operations on a cell data.

Figure 2:
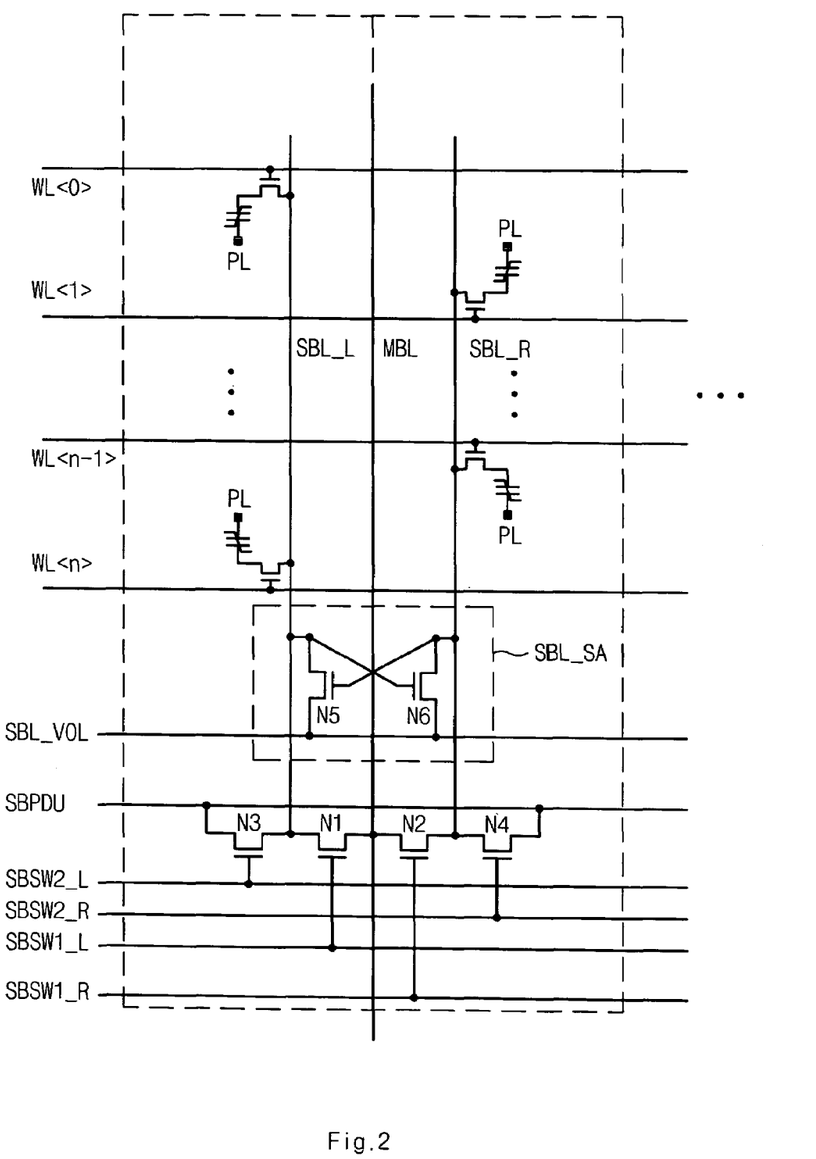
FIG. 2 is a detailed circuit diagram illustrating the architecture of a sub cell array of FIG. 1.

FIG. 2 is a detailed circuit diagram illustrating the architecture of a sub cell arrays of FIG. 1.

In each sub cell array, a main bit line MBL is shared by two sub bit lines SBL_L, SBL_R located adjacent to both sides of the main bit line MBL. Therefore, compared to a prior art sub cell array where one sub bit line SBL corresponds to one main bit line MBL, the number of main bit lines MBL of the sub cell array according to the present invention is reduced by half.

Also, the cells connected to two sub bit lines SBL_L, SBL_R corresponding to the same main bit line MBL in a sub cell array SCA(n) have a folded bit line architecture, which means that the cells do not share a word line WL<0>–WL<n>. That is, n-bit data are stored in cells corresponded to the two sub bit lines SBL_L, SBL_R.

When a sub bit line selection signal SBSW1_L or SBSW1_R is activated, an NMOS transistor N1 or N2 is turned on, and a load on the main bit line MBL is charged down to a level of the sub bit line SBL_L or SBL_R. A sub bit line pull down/up signal SBPDU is a signal for adjusting power supply to the sub bit lines SBL_L, SBL_R, and sub bit line selection signals SBSW2_L, SBSW2_R are signals for adjusting a signal flow between a sub bit line pull down/up signal SBPDU line and sub bit lines SBL_L, SBL_R, respectively. In the case of generating a high level or a low level voltage in the sub bit lines SBL_L, SBL_R, the high level or the low level voltage is supplied as the sub bit line pull down/up signal SBPDU, and the sub bit line selection signals SBSW2_2, SBSW2_R is activated. Then NMOS transistors N3, N4 are turned on, and the high level or low level voltage is supplied to the sub bit lines SBL_L, SBL_R.

As it is noted before, in the present invention, two sub bit lines SBL_L, SBL_R share one main bit line MBL. Therefore, different sub bit line selection signals SBSW1_L, SBSW1_R, SBSW2_L, and SBSW2_R are used to separately control the sub bit lines SBL_L, SBL_R.

The sub bit line sense amp SBL_SA, while the sub bit line SBL_L or SBL_R where the cell data is transferred and the main bit line MBL are electrically disconnected by turning off of the NMOS transistors N1, N2, senses a voltage of the sub bit line SBL_L or SBL _R; compares the voltage level to a voltage level of a sensing control signal SBL_VOL; and amplifies the voltage level of the sub bit line SBL_L or SBL_R, according to the level difference of the voltages. As for the sub bit line sense amp SBL_SA, two NMOS transistors N5, N6 are cross-coupled to two sub bit lines SBL_L, SBL_R. In other words, the NMOS transistor N5 is connected between the sub bit line SBL_L and the sensing control signal SBL_VOL line, and a gate of the NMOS transistor N5 is connected to the sub bit line SBL_R. In a similar way, the NMOS transistor N6 is connected between the sub bit line SBL_R and the sensing control signal SBL_VOL line, and a gate of the NMOS transistor N6 is connected to the sub bit line SBL_L.

Figure 3:
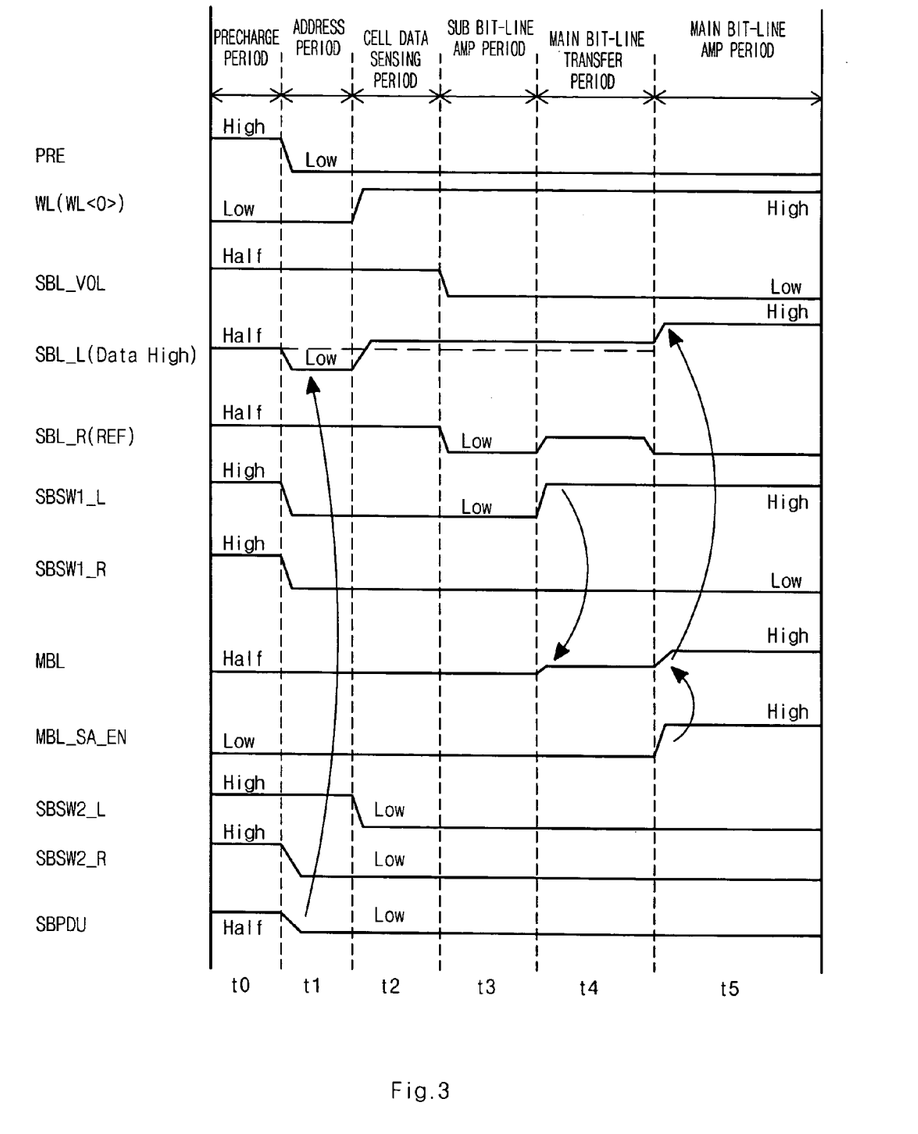
FIG. 3 is a timing diagram illustrating the operation of a sub cell array having the same architecture with FIG. 2, in which a data in a selected cell of the sub cell array is high.

FIG. 3 is a timing diagram illustrating the operation of a sub cell array having the same architecture with FIG. 2, in which a data in a selected cell of the sub cell array is high.

In FIG. 3, a t0 period is a pre-charge period. If a pre-charge signal PRE is activated in t0 period, the sub bit lines SBL_L, SBL_R, the sensing control signal SBL_VOL, the main bit line MBL, and the sub bit line pull down/up signal SBPDU are pre-charged at a half VCC level, which is the half level of the power voltage. At this time, levels of the sub bit line selection signals SBSW1_L, SBSW1_R, SBSW2_L, and SBSW2_R become high.

A t1 period is an address decoding period, and this period is required to activate a selected cell array by an external address input signal. In t1 period, the pre-charge signal PRE is transited to a low level. If the sub bit line pull down/up signal SBPDU is transited to a low level while the sub bit line selection signal SBSW2_L being kept at a high level, the voltage of the sub bit lint SBL_L is transited to a low level.

Next, if the word line WL<0> is selected and activated in t2 period, a corresponding cell data (high) is transferred to the sub bit line SBL_L and the voltage level of the sub bit line SBL_L is increased higher than half VCC. That is, a cell's high data charge is shared by the capacitance of the sub bit line SBL_L and thus, the voltage level of the sub bit line SBL_L is increased. On the other hand, in the case of the sub bit line SBL_L, no cell is selected so the pre-charge voltage, half VCC, is maintained.

If the sensing control signal SBL_VOL is transited to a low level in t3 period, the NMOS transistor N6 of the sub bit line sense amp SBL_SA is turned on and as a result of this, the sub bit line SBL_R is transited to a low level. As the sub bit line SBL_R is transited to a low level, the NMOS transistor N5 on the other hand is kept to maintain an off state, whereby the sub bit line SBL_L can keep the voltage level.

If the sub bit line selection signal SBSW1_L is activated to high in t4 period, the NMOS transistor N1 is turned on and the voltage of the sub bit line SBLB_L is transferred to the main bit line MBL.

When the sub bit line SBL_L signal is sufficiently transferred to the main bit line MBL, in t5 period, a main bit line sense amp enable signal MBL_SA_EN is activated to high and the main bit line sense amp MBL_SA amplifies the voltage of the main bit line MBL to a high level.

The amplified main bit line MBL signal is transmitted again to the sub bit line SBL_L through the NMOS transistor N1, and is used as a restore signal for restoring a selected ferroelectric cell's destroyed data.

Figure 4:
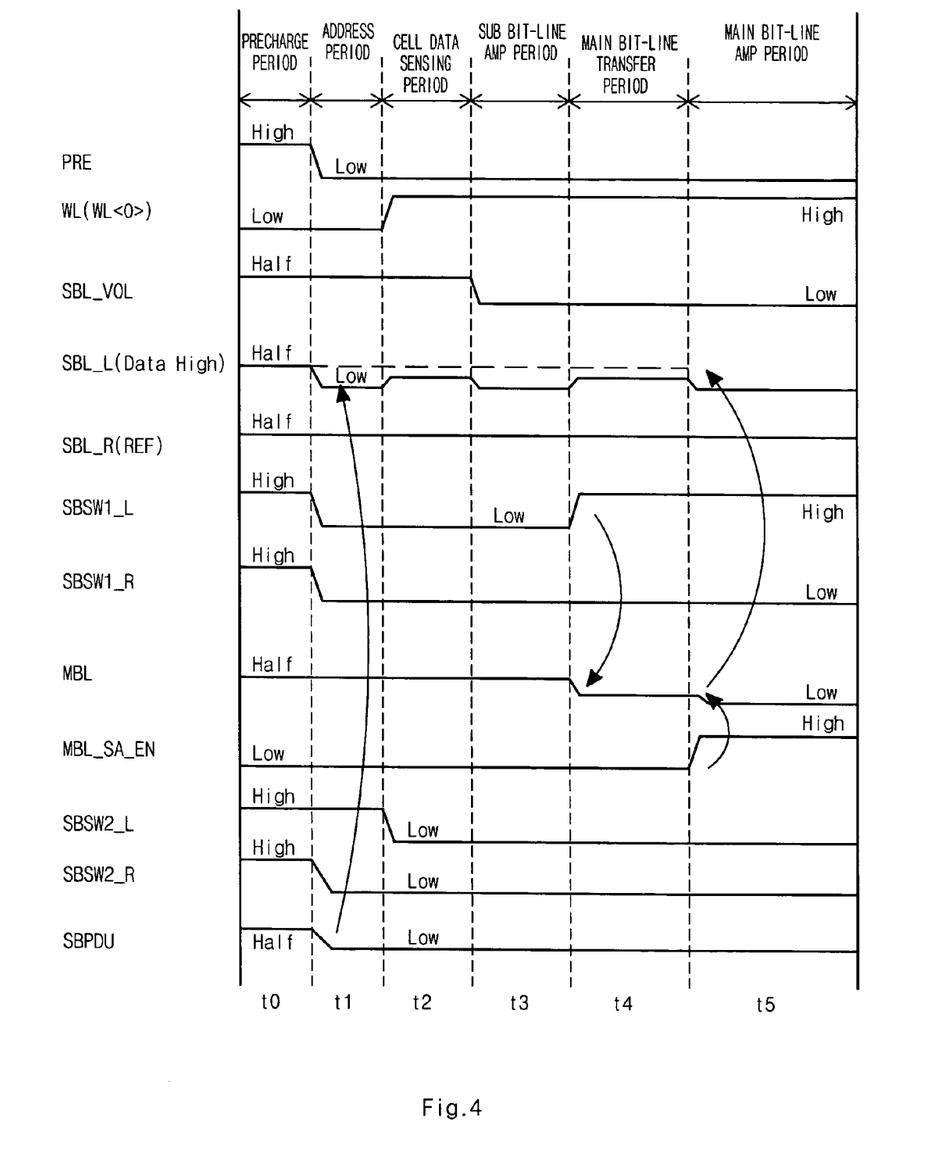
FIG. 4 is a timing diagram illustrating the operation of a sub cell array having the same architecture with FIG. 2, in which a data in a selected cell of the sub cell array is low.

FIG. 4 is a timing diagram illustrating the operation of a sub cell array having the same architecture with FIG. 2, in which a data in a selected cell of the sub cell array is low.

A t0 period is a pre-charge period and a t1 period is an address decoding period.

In t2 period, if the word line WL<0> is selected and activated, a corresponding cell data (low) is transferred to the sub bit line SBL_L and the voltage level of the sub bit line SBL_L is slightly increased, but still less than half VCC. That is, a cell's low data charge is shared by the capacitance of the sub bit line SBL_L and thus, the voltage level of the sub bit line SBL_L is slightly increased, but still less than half VCC. On the other hand, in the case of the sub bit line SBL_L, no cell is selected so the pre-charge voltage, half VCC, is maintained.

In t3 period, if the sensing control signal SBL_VOL is transited to a low level, the NMOS transistor N6 of the sub bit line sense amp SBL_SA is turned off and as a result of this, the sub bit line SBL_R is maintained at the half VCC level. The NMOS transistor N5, on the other hand, is turned on and thus, the sensing voltage of the sub bit line SBL_L is transited to a low level. If the sub bit line selection signal SBSW1_L is activated to high in t4 period, the NMOS transistor N1 is turned on and the sensing voltage of the sub bit line SBLB_L is transferred to the main bit line MBL.

In t5 period, when the sub bit line SBL_L signal is sufficiently transferred to the main bit line MBL, the main bit line sense amp enable signal MBL_SA_EN is activated to high and the main bit line sense amp MBL_SA amplifies the voltage of the main bit line MBL to a high level.

The amplified main bit line MBL signal is transmitted again to the sub bit line SBL_L through the NMOS transistor N1, and is used as a restore signal.

Figure 5:
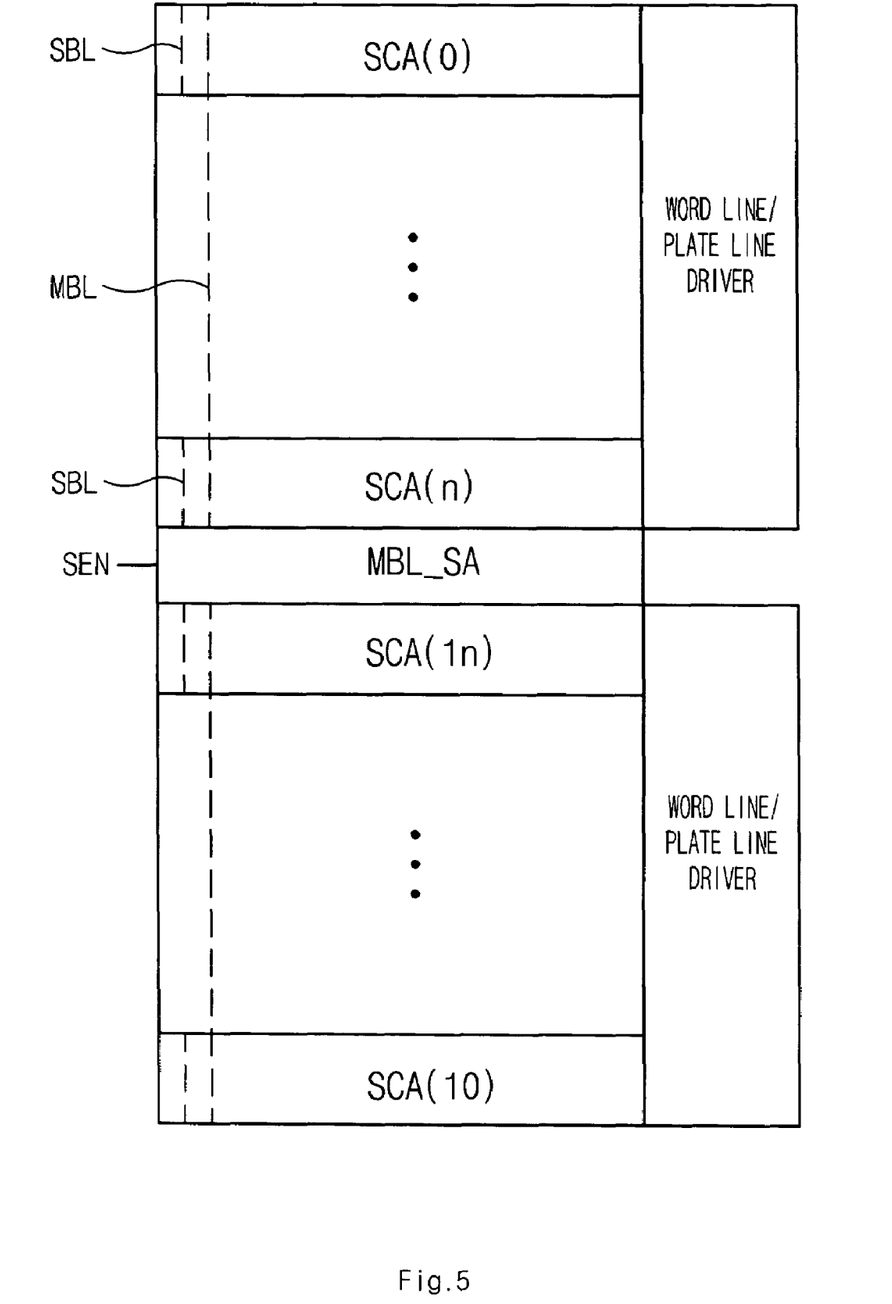
FIG. 5 is a schematic diagram of a non-volatile ferroelectric cell array block in accordance with a second embodiment of the present invention.

FIG. 5 is a schematic diagram of a non-volatile ferroelectric cell array block in accordance with a second embodiment of the present invention.

As shown in FIG. 5, the cell array block includes a plurality of upper sub cell array SCA(0)–SCA(n), a plurality of lower sub cell array SCA(10)–SCA(1n), a main bit line sense amp MBL_SA, and a word line/plate line driver.

The upper sub cell array SCA(0)–SCA(n) and the lower sub cell array SCA(10)–SCA(1n) are located to be vertically symmetric about the main bit line sense amp MBL_SA.

In the sub cell arrays SCA(0)–SCA(n), SCA(10)–SCA(1n), ferroelectric memory cells for data storage, each with a ferroelectric capacitor and a transistor, are connected to the sub bit lines SBL. The sub bit line SBL is provided to a respective sub cell array SCA(0)–SCA(n), SCA(10)–SCA(1n), and the main bit line MBL is shared by the respective sub cell array SCA(0)–SCA(n) and SCA(10)–SCA(1n). In the respective sub cell array SCA(0)–SCA(n) and SCA(0)–SCA(1n), the sub bit line SBL is corresponds one by one the main bit line MBL, and induces a sensing voltage of the main bit line MBL according to a cell data. That is, each sub cell array SCA(0)–SCA(n), SCA(10)–SCA(1n) has a hierarchy transfer sensing architecture, wherein a current applied from a power voltage VCC to the main bit line MBL is adjusted in accordance with a cell data that is applied to the sub bit line SBL and a sensing voltage is generated at the main bit line MBL.

The main bit line sense amp MBL_SA is shared by the main bit line of the upper sub cell array SCA(0)–SCA(n) and the main bit line of its symmetric lower sub cell array SCA(10)–SCA(1n), and amplifies the induced sensing voltage in those two main bit lines MBL, in response to a sensing signal SEN.

The word line/plate line driver selectively activates a word line and a plate line in the upper sub cell array SCA(0)–SCA(n) and the lower sub cell array SCA(10)–SCA(1n) to control the read/write operations on a cell data.

Figure 6:
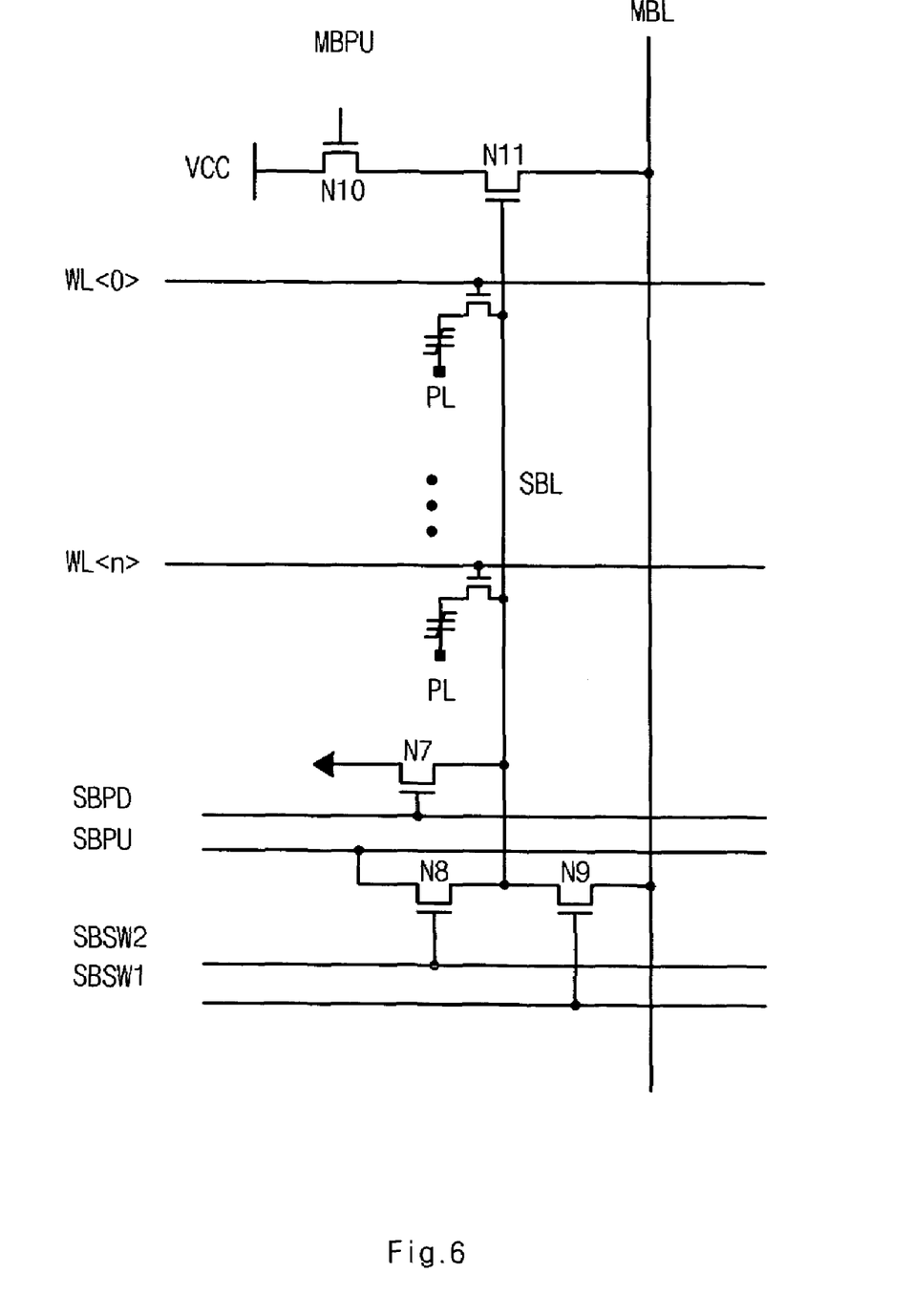
FIG. 6 is a detailed circuit diagram illustrating the architecture of a sub cell array of FIG. 5 in accordance with a first embodiment of the present invention.

FIG. 6 is a detailed circuit diagram illustrating the architecture of a sub cell arrays of FIG. 5 in accordance with a first embodiment of the present invention.

If the sub bit line selection signal SBSW1 is activated, an NMOS transistor N9 is turned on and a load on the main bit line is charged to the level of one sub bit line SBL. In addition, if the sub bit line pull down signal SBPD is activated, an NMOS transistor N7 is turned on and the sub bit line SBL is pulled down to the ground voltage level.

The sub bit line pull up signal SBPU is a signal for adjusting power supply to the sub bit line SBL, and the sub bit line selection signal SBSW2 adjusts the sub bit line pull up signal SBPU to be applied to the sub bit line SBL. For example, to generate a high voltage to the sub bit line SBL, a higher voltage than the power voltage VCC is supplied as the sub bit line pull up signal SBPU, and the sub bit line selection signal SBSW2 is activated. Through the activation of the sub bit line selection signal SBSW2, an NMOS transistor N8 is turned on and the sub bit line pull up signal SBPU with a high voltage is provided to the sub bit line SBL. Also, a plurality of non-volatile ferroelectric cells are connected to the sub bit line SBL.

An NMOS transistor N10 is connected between the power voltage VCC and an NMOS transistor Nil, and the main bit line pull up signal MBPU is applied to gate terminals. The NMOS transistor N11 is connected between an NMOS transistor N11 and the main bit line MBL, and gate terminals are connected to the sub bit line SBL. When the main bit line pull up signal MBPU is activated, the NMOS transistor N11 adjusts a current supplied to the main bit line MBL by the power voltage VCC according to the sensing voltage of the sub bit line SBL to induce a sensing voltage of the main bit line MBL. For example, if a cell data is high, a high cell voltage is applied to the sub bit line SBL and thus, the amount of current flowing through the NMOS transistor N11 becomes larger. As a result of this, a high sensing voltage is induced in the main bit line MBL. On the contrary, if a cell data is low, a low cell voltage is applied to the sub bit line SBL and thus, the amount of current flowing through the NMOS transistor N11 becomes smaller. As a result of this, a low sensing voltage is induced in the main bit line MBL. Therefore, it is now possible to sense a data of a selected cell by using the difference of the sensing voltage levels induced in the main bit line MBL.

Figure 7:
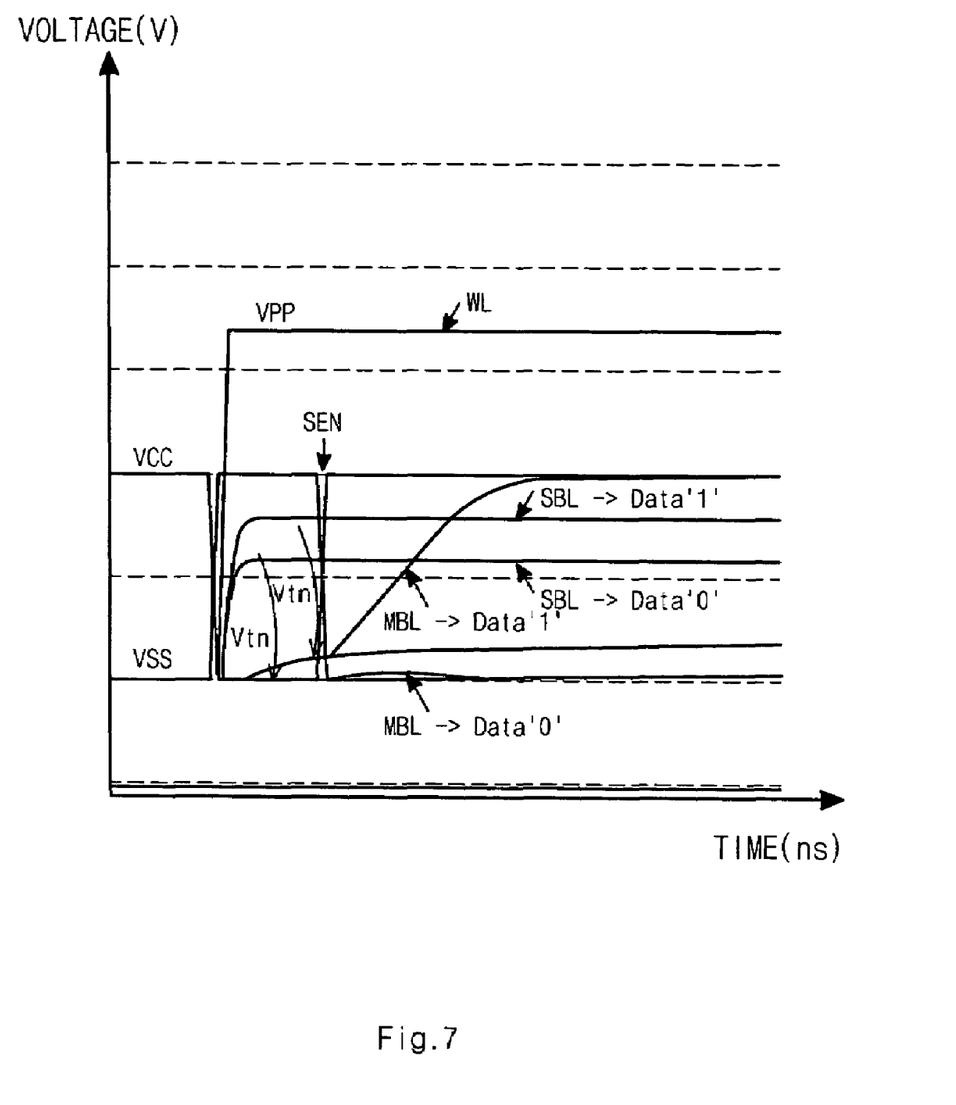
FIG. 7 is a waveform diagram illustrating an operating waveform in a cell array of FIG. 6.

FIG. 7 is a waveform diagram illustrating an operating waveform in the cell array of FIG. 6.

If a world line WL and a plate line PL signal are activated to a pumping level VPP, a cell data is transferred to the sub bit line SBL and the sub bit line SBL voltage is increased. As the voltage in the sub bit line SBL increases, the NMOS transistor N11 is turned on and a current flows into the main bit line MBL, thereby inducing the sensing voltage to the main bit line MBL. In other words, the amount of current flowing into the main bit line MBL is in dependence of the voltage level of the sub bit line SBL, and the sub bit line SBL signal is transferred to the main bit line MBL. At this time, the voltage of the main bit line MBL is lower than the voltage of the sub bit line SBL by a threshold voltage of the NMOS transistor N11 and is transferred. However, its phase is equal with that of the sub bit line SBL.

Next, if a sensing signal SEN is activated, the sensing voltage of the main bit line MBL is amplified by the main bit line sense amp MBL_SA.

Figure 8:
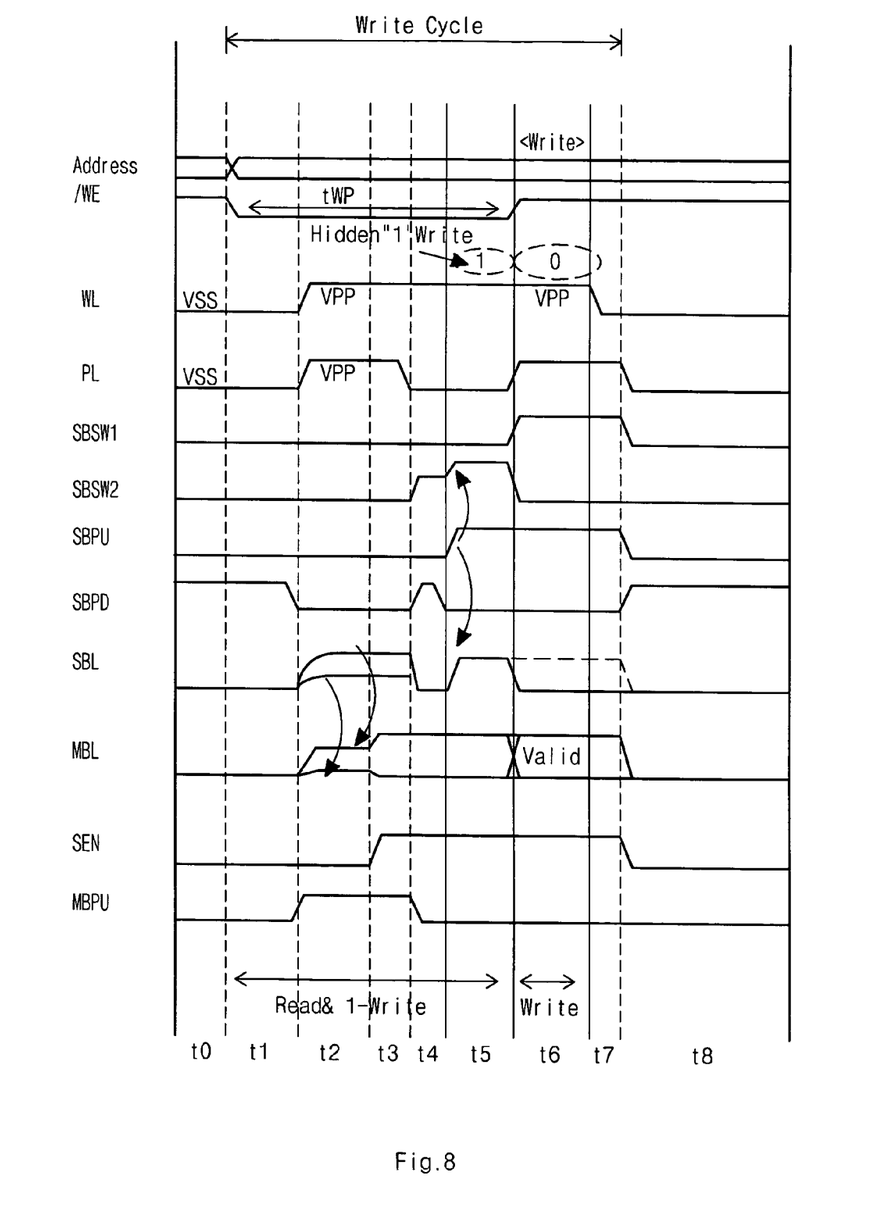
FIG. 8 is a timing diagram for describing a write mode operation of a sub cell array of FIG. 6.

FIG. 8 is a timing diagram for describing a write mode operation of the sub cell array in FIG. 6.

In FIG. 8, t0 denotes a pre-charge period. In this pre-charge period, the main bit line MBL and the sub bit line SBL are pulled down.

In t1 period, if an address is transited and a write enable signal/WE is inactivated to low, the sub cell array becomes a write mode active state. The main bit line MBL and the sub bit line SBL maintain their pull down states in this t1 period also.

Likewise, because the main bit line MBL and the sub bit line SBL are maintained at a low level before the word line WL and the plate line PL are activated, it becomes possible to prevent current leakage from NMOS transistors connected to the bit lines MBL, SBL, or to prevent current leakage by a short, so that standby current can be reduced.

In t2 period, if the word line WL and the plate line PL are enabled to high, a data of a selected cell by the enabled word line WL is applied to the sub bit line SBL. Moreover, if the cell data is applied to the sub bit line SBL while the main bit line pull up signal MBPU is activated, the NMOS transistor N11 is turned on and a sensing voltage is induced in the main bit line MBL. In this case, since the amount of current flowing into the main bit line MBL through the NMOS transistor N11 varies according to the cell data, sensing voltage having different level according to the cell data is induced in the main bit line MBL. Also, the sub bit line SBL voltage and the main bit line MBL voltage are in the same phase.

In t3 period, when the sensing signal SEN is activated, the voltage induced in the main bit line MBL is sensed and amplified by the main bit line sense amp MBL_SA.

In t4 period, as the voltage of the plate line PL is inactivated to low and the sub bit line pull down signal SBPD is activated to high, the sub bit line SBL is adjusted to the ground level. Further, the main bit line pull up signal MBPU becomes low.

In t5 period, if a high voltage is applied as the sub bit line pull up signal SBPU and the sub bit line selection signal SBSW2 is pumped, a high voltage is transferred to the sub bit line SBL. Accordingly, a high data (Hidden "1") is written, regardless of data to be written, in every cell connected to the driving word line WL.

In t6 period, if the write enable signal/WE is activated to high, a data write operation is performed. To this end, the plate line PL voltage is activated to the pumping level VPP again and the sub bit line selection signal SBSW2 is transited to a low level. Moreover, the sub bit line selection signal SBSWL is activated to high, and write data that has been transferred to the main bit line MBL through a data bus (not shown) is transferred to the sub bit line SBL and is written in a cell. At this time, if the data in the sub bit line SBL is high, the data (Hidden "1") written in the t5 period is preserved. If the data in the sub bit line SBL is low, on the other hand, a low data is written in a corresponding cell. That is, the t6 period is a period where an external low data ("0") is written in a cell.

After a data write operation is complete, in t7 period, the word line WL is earlier inactivated for a certain period than the plate line PL.

Figure 9:
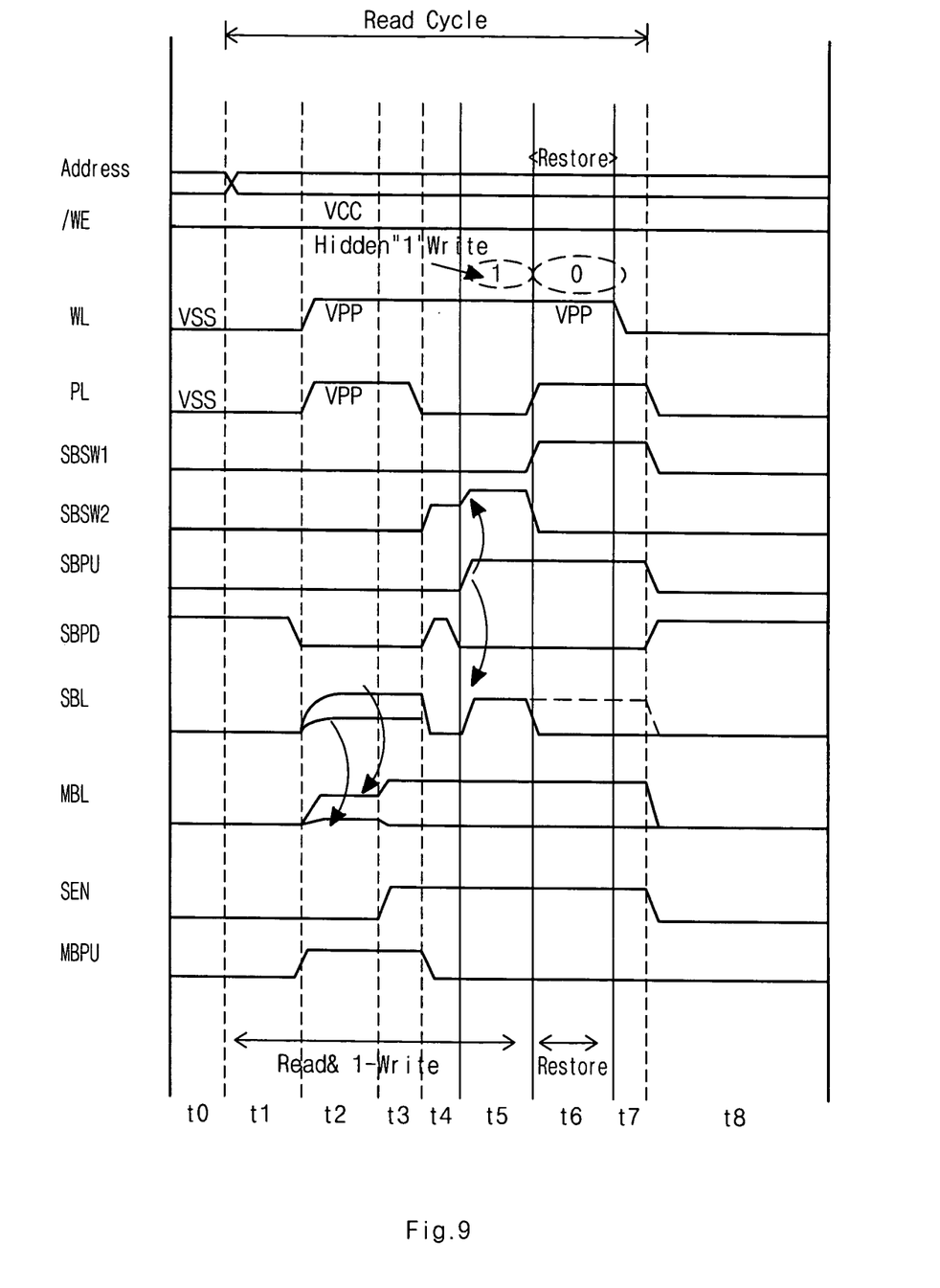
FIG. 9 is a timing diagram for describing a read mode operation of a sub cell array of FIG. 6.

FIG. 9 is a timing diagram for describing a read mode operation of the sub cell array of FIG. 6.

In read mode, the write enable signal/WE maintains the power voltage VCC level.

In t0–t5 periods, a data in a selected cell is sensed, amplified, and outputted, and the Hidden data "1" is written in the selected cell. The t0 through t5 periods correspond to the t0–t5 periods of FIG. 8.

In t6 period, if the voltage of the plate line PL is activated to the pumping level again and the sub bit line selection signal SBSW1 is activated, read data induced in the main bit line MBL is transferred to the sub bit line SBL and is restored in a cell. If the data of the sub bit line SBL is high, the data written in the t5 period is preserved. If the data in the sub bit line SBL is low, on the other hand, a low data is restored in a corresponding cell. Therefore, it is the t6 period where a sensed, amplified internal data is written and restored in a cell again. At this time, because the voltage of the main bit line MBL and the voltage of the sub bit line SBL are in the same phase, unlike a related art hierarchy architecture, there is no need to invert the voltage level of the main bit line MBL but data is transferred directly to the sub bit line.

After the completion of data restore, in t7 period, the word line WL is earlier inactivated for a certain period than the plate line PL.

Figure 10:
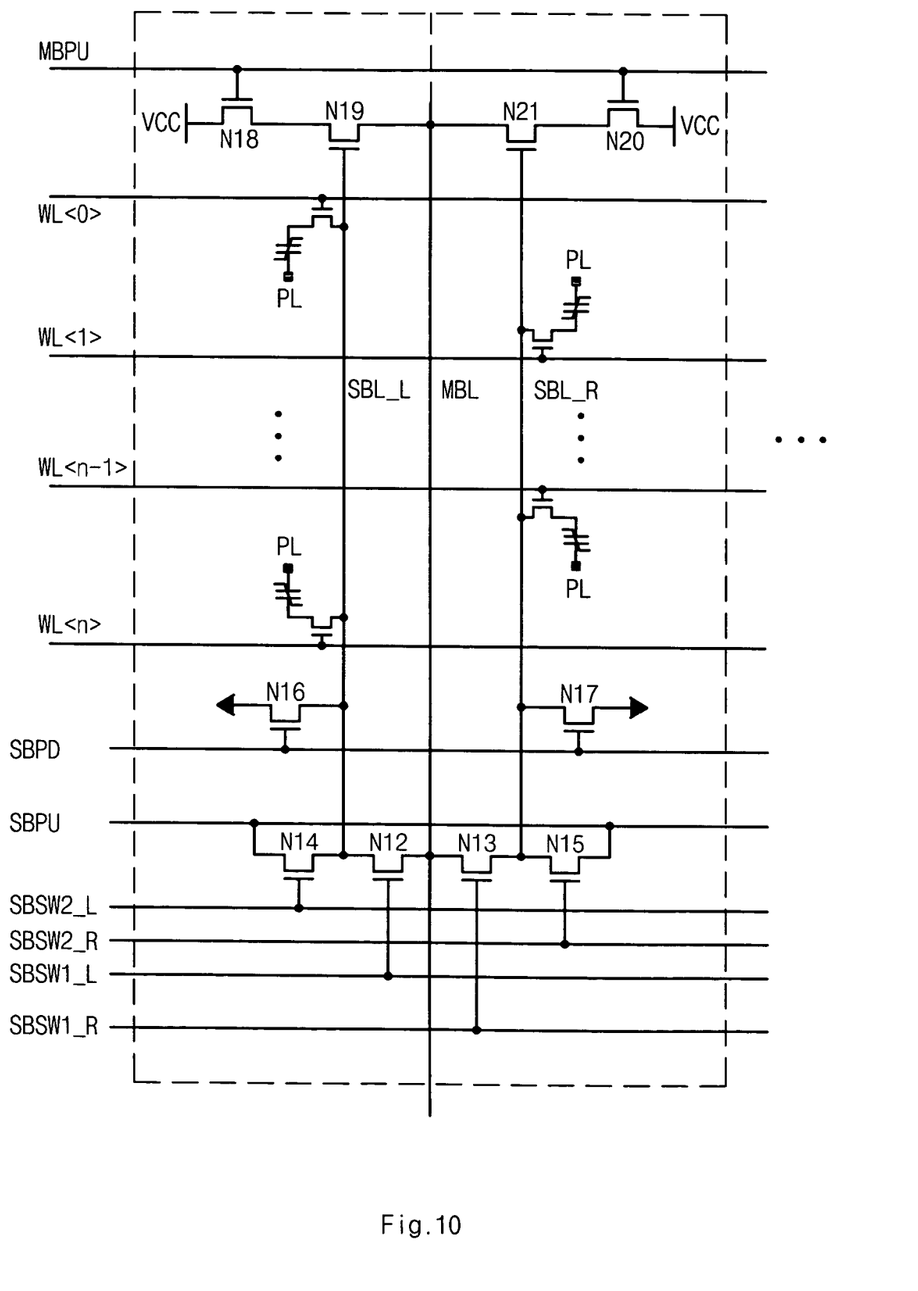
FIG. 10 is a detailed circuit diagram illustrating the architecture of another sub cell array of FIG. 5 in accordance with a second embodiment of the present invention.

FIG. 10 is a detailed circuit diagram illustrating the architecture of another sub cell array of FIG. 5 in accordance with a second embodiment of the present invention.

In each sub cell array, a main bit line MBL is shared by two sub bit lines SBL_L, SBL_R located adjacent to both sides of the main bit line MBL, as illustrated in FIG. 2. Also, the cells connected to two sub bit lines SBL_L, SBL_R corresponding to the same main bit line MBL in a sub cell array have a folded bit line architecture, which means that the cells do not share a word line WL<0>–WL<n>.

When a sub bit line selection signal SBSW1_L or SBSW1_R is activated, an NMOS transistor N12 or N13 is turned on, and a load on the main bit line MBL is charged down to a level of the sub bit line SBL_L or SBL_R. Also, if the sub bit line pull down signal SBPD is activated, the NMOS transistors N16, N17 are turned on, and the sub bit lines SBL_L, SBL_R are pulled down to the ground voltage level. The sub bit line pull up signal SBPU is a signal for adjusting power supply to the sub bit lines SBL_L, SBL_R. In addition, the sub bit line selection signals SBSW2_L, SBSW2_R selectively turn on/off NMOS transistors N14, N15, respectively, and adjust a signal flow between the sub bit line pull up signal SBPU line and the sub bit lines SBL_L, SBL_R.

As it is described before, in the present invention, two sub bit lines SBL_L, SBL_R share one main bit line MBL. Therefore, different sub bit line selection signals SBSW1_L, SBSW1_R, SBSW2_L, and SBSW2_R are used to separately control sub bit lines SBL_L, SBL_R.

NMOS transistors N18, N20 are connected between the power voltage VCC and NMOS transistors N19, N21, respectively, and the main bit line pull up signal MBPU is applied to gate terminals. The NMOS transistors N19, N21 are connected between the NMOS transistors N18, N20, respectively, and gate terminals are connected to the sub bit lines SBL_L, SBL_R, respectively. When the main bit line pull up signal MBPU is activated, the NMOS transistors N19, N21 adjust the amount of current to be supplied to the main bit line MBL by the power voltage VCC, according to a corresponding sensing voltage of the sub bit lines SBL_L, SBL_R, and induce the sensing voltage of the main bit line MBL. These operational principles using a current gain are the same with those in FIG. 6.

Figure 11:
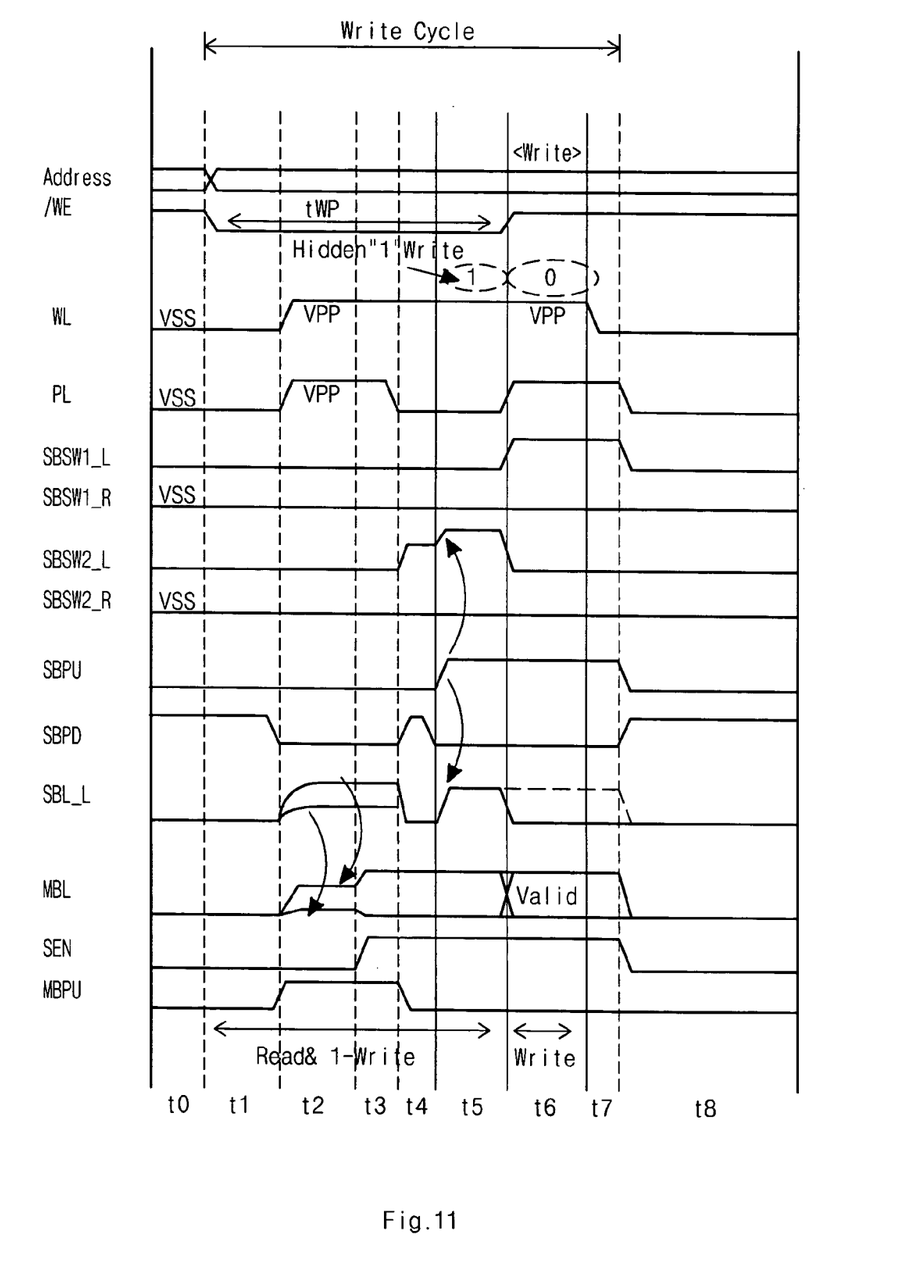
FIG. 11 is a timing diagram for describing a write mode operation of a sub cell array of FIG. 10.

FIG. 11 is a timing diagram for describing a write mode operation of the sub cell array of FIG. 10.

In FIG. 11, t0 period is a pre-charge period. In this pre-charge period, the main bit line MBL and the sub bit line SBL are pulled down.

In t1 period, if an address is transited and a write enable signal/WE is inactivated to low, the sub cell array becomes a write mode active state. The main bit line MBL and the sub bit line SBL maintain pull down states in this t1 period also.

Likewise, because the main bit line MBL and the sub bit line SBL are maintained at a low level before the word line WL and the plate line PL are activated, it becomes possible to prevent current leakage from NMOS transistors connected to the bit lines MBL, SBL, or to prevent current leakage by a short, so that standby current can be reduced.

The following will now explain a case where -a cell connected to the sub bit line SBL_L is selected.

In t2 period, if the word line WL and the plate line PL are enabled to high, a data of a selected cell by the enabled word line WL is applied to the sub bit line SBL_L. Moreover, if the cell data is applied to the sub bit line SBL_L while the main bit line pull up signal MBPU is activated, the NMOS transistor N19 is turned on and a sensing voltage is induced in the main bit line MBL. In this case, since the amount of current flowing into the main bit line MBL through the NMOS transistor N19 varies according to the cell data, sensing voltage having different level according to the cell data are induced in the main bit line MBL. Also, the sub bit line SBL voltage and the main bit line MBL voltage are in the same phase.

In t3 period, when the sensing signal SEN is activated, the voltage induced in the main bit line MBL is sensed and amplified by the main bit line sense amp MBL_SA.

In t4 period, as the voltage of the plate line PL is inactivated to low and the sub bit line pull down signal SBPD is activated to high, the sub bit line SBL_L is adjusted to the ground level. Further, the main bit line pull up signal MBPU becomes low.

In t5 period, if a high voltage is applied as the sub bit line pull up signal SBPU and the sub bit line selection signal SBSW2_L is pumped, a high voltage is transferred to the sub bit line SBL_L. Accordingly, a high data (Hidden "1") is written, regardless of data to be written, in all cell connected to the driving word line WL.

In t6 period, if the write enable signal/WE is activated to high, a data write operation is performed. To this end, the plate line PL voltage is activated to the pumping level VPP again and the sub bit line selection signal SBSW2_L is transited to a low level. Moreover, the sub bit line selection signal SBSW1_L is activated to high, and write data that has been transferred to the main bit line MBL through a data bus (not shown) is transferred to the sub bit line SBL_L and is written in a cell. At this time, if the data in the sub bit line SBL_L is high, the data (Hidden "1") written in the t5 period is preserved. If the data in the sub bit line SBL_L is low, on the other hand, a low data is written in a corresponding cell. That is, the t6 period is a period where an external low data ("0") is written in a cell.

After a data write operation is complete, in t7 period, the word line WL is earlier inactivated for a certain period than the plate line PL.

Figure 12:
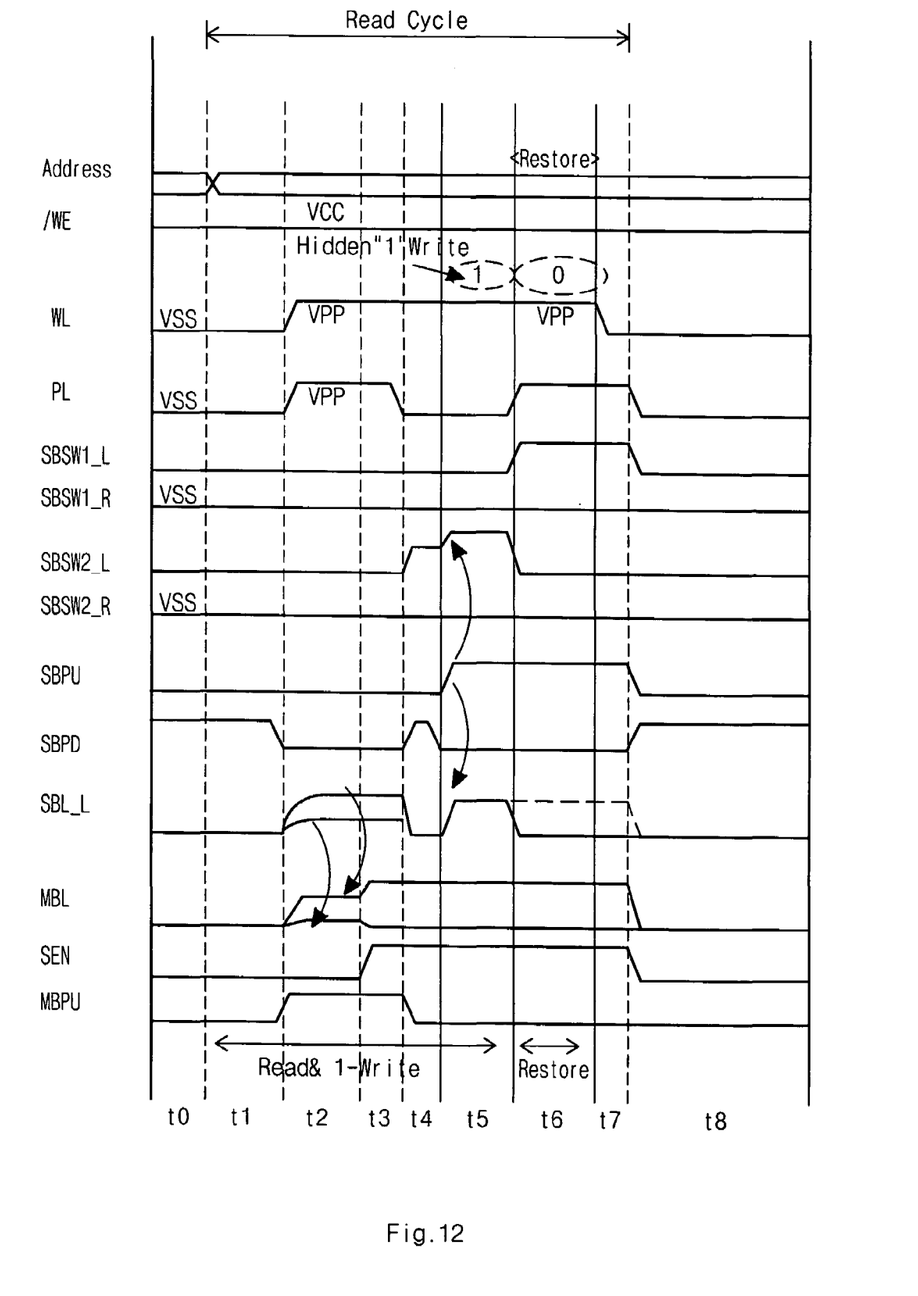
FIG. 12 is a timing diagram for describing a read mode operation of a sub cell array of FIG. 10.

FIG. 12 is a timing diagram for describing a read mode operation of the sub cell array of FIG. 10.

In read mode, the write enable signal/WE maintains the power voltage VCC level.

In t0–t5 periods, a data in a selected cell is sensed, amplified, and outputted, and the Hidden data "1" is written in the selected cell. The t0 through t5 periods correspond to the t0–t5 periods of FIG. 11.

In t6 period, if the voltage of the plate line PL is activated to the pumping level again and the sub bit line selection signal SBSW1_L is activated, read data induced in the main bit line MBL is transferred to the sub bit line SBL_L and is restored in a cell. If the data in the sub bit line SBL_L is high, the data written in the t5 period is preserved. If the data in the sub bit line SBL_L is low, on the other hand, a low data is restored in a corresponding cell. Therefore, it is the t6 period where a sensed, amplified internal data is written and restored in a cell again.

After the completion of data restore, in t7 period, the word line WL is earlier inactivated for a certain period than the plate line PL.

As described above, according to the non-volatile ferroelectric cell array block having a hierarchy transfer sensing architecture of the present invention, during a cell data sensing operation, the capacitance of a respective sub bit-line is independent of the capacitance of a main bit-line so that cell sensing capacitance is limited to the capacitance of the sub bit-line, whereby a cell data can be read and written more stably even with a small cell capacitance. Moreover, a layout area can be reduced by making a plurality of sub bit lines correspond to one main bit line.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A non-volatile ferroelectric cell array block having a hierarchy transfer sensing architecture, comprising:
   a plurality of sub cell arrays, each with a hierarchy bit line architecture, wherein each of a plurality of main bit lines is connected to a plurality of sub bit lines which are formed at both sides of one main bit line and selectively connected to the one main bit line to transfer cell data;
   a plurality of sub bit line sense amplifiers corresponding one by one to the sub cell arrays, sensing a cell data transferred to a sub bit line of a corresponding sub cell array in response to a sensing control signal and thereby amplifying the cell data of the corresponding sub bit line;
   a main bit line sense amplifier, sensing the cell data transferred to the corresponding main bit line from the sub bit line amplified by the sub bit line sense amplifier and thereby amplifying the cell data of the main bit line; and
   a word line/plate line driver, selectively activating a word line/a plate line of the sub cell array for a read and write operation of the cell data.

2. The cell array block according to claim 1, wherein the sub cell array has a folded bit line architecture.

3. The cell array block according to claim 2, wherein the sub bit line sense amplifier senses a voltage level of the sub bit line, compares the sensed voltage level with a voltage level of the sensing control signal, and amplifies a voltage level of the sub bit line according to a voltage difference between the sensed voltage level and the voltage level of the sensing control signal while the main bit line are electrically disconnected from the sub bit line.

4. A non-volatile ferroelectric cell array block having an hierarchy transfer architecture, comprising:

a plurality of upper sub cell arrays and a plurality of lower sub cell arrays, each with a hierarchy bit line architecture, wherein each of a plurality of main bit lines is connected to a plurality of sub bit lines, and the amount of current to be transferred from a power voltage to a main bit line is adjusted to induce a sensing voltage of the main bit line according to a sensing voltage of a cell data on the sub bit line;

a main bit line sense amplifier located between the plurality of upper sub cell arrays and the plurality of lower sub cell arrays, sensing a sensing voltage of an upper main bit line shared by the plurality of upper sub cell arrays and a sensing voltage of a lower main bit line shared by the plurality of lower sub cell arrays, in response to a sensing signal, and amplifying the sensing voltages; and word line/plate line drivers, selectively activating word lines and plate lines of the sub cell arrays for a read and write operation of the cell data.

5. The cell array block according to claim 4, wherein the main bit line and the sub bit lines maintain the ground voltage state before the word line and the plate line are activated to read or write the cell data.

6. The cell array block according to claim 4, wherein the sub cell array includes the plurality of main bit lines each connected to the plurality of sub bit lines located symmetrically around the main bit line, and a sensing voltage of the main bit line is induced by regulating the amount of current transmitted from a power voltage to the main bit line depending on a sensing voltage of one of the plurality of sub bit lines which receives cell data.

7. The cell array block according to claim 6, wherein the main bit line and the sub bit lines maintain the ground voltage state before the word line and the plate line are activated to read or write the cell data.

* * * * *